(12) United States Patent
Rossman (10) Patent No.: US 9,661,776 B2
(45) Date of Patent: May 23, 2017

(54) MOUNTING ASSEMBLY AND BACKPLANE COMMUNICATION SYSTEM

(71) Applicant: Tyco Electronics Corporation, Berwyn, PA (US)

(72) Inventor: Jared Evan Rossman, Dover, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 539 days.

(21) Appl. No.: 14/147,126

(22) Filed: Jan. 3, 2014

(65) Prior Publication Data

US 2015/0195942 A1 Jul. 9, 2015

(51) Int. Cl.
*H05K 7/14* (2006.01)

(52) U.S. Cl.
CPC ......... *H05K 7/1451* (2013.01); *H05K 7/1445* (2013.01); *Y10T 403/7075* (2015.01)

(58) Field of Classification Search
CPC ................ H05K 7/1451; H05K 7/1445; Y10T 403/7075
USPC .................................................. 361/803, 759
See application file for complete search history.

(56) References Cited

U.S. PATENT DOCUMENTS

| | | | |
|---|---|---|---|
| 7,607,929 B1 * | 10/2009 | Nguyen | H01R 13/6315 439/246 |
| 8,096,829 B2 * | 1/2012 | Malloy | H01R 9/05 439/578 |
| 8,366,485 B2 * | 2/2013 | Johnescu | H01R 13/514 439/108 |
| 8,647,128 B2 * | 2/2014 | Sykes | H01R 24/44 439/578 |
| 8,851,940 B2 * | 10/2014 | Friedhof | H01R 13/111 439/843 |
| 9,147,963 B2 * | 9/2015 | Balcer | H01R 9/0524 |
| 2006/0084286 A1 * | 4/2006 | Kooiman | H01R 24/52 439/63 |
| 2012/0164878 A1 * | 6/2012 | Yi | H01R 24/52 439/540.1 |
| 2012/0315788 A1 * | 12/2012 | Montena | H01R 9/05 439/507 |
| 2014/0360753 A1 * | 12/2014 | Sechrist | H05K 7/1449 174/79 |

* cited by examiner

*Primary Examiner* — Tuan T Dinh
*Assistant Examiner* — Rockshana Chowdhury (57) ABSTRACT

Mounting assembly for a backplane communication system. The mounting assembly includes a retention collet that has a collet base and a coupling arm that extends from the collet base. The collet base includes a passage therethrough. The collet base is configured to be mounted to a backplane such that the passage extends through the backplane and the coupling arm extends from the collet base away from the backplane. The mounting assembly also includes a spacer member having a member cavity that receives the coupling arm when the spacer member is mounted to the backplane. The coupling arm is held in a locked position when engaged by a guide pin that has been inserted through the passage of the collet base and into the member cavity. The retention collet and the spacer member are interlocked when the coupling arm is in the locked position.

20 Claims, 8 Drawing Sheets

FIG. 10

MOUNTING ASSEMBLY AND BACKPLANE COMMUNICATION SYSTEM

BACKGROUND

The subject matter herein relates generally to an assembly for mounting communication connectors to a wall in a system or device, such as a backplane of a backplane communication system.

Backplane or midplane communication systems, such as network systems, servers, data centers, and the like, utilize large circuit boards that are known as backplanes or midplanes. The terms "backplane" and "midplane" may be used interchangeably with respect to the subject matter described herein. The backplanes may be used to interconnect communication devices, such as daughter card assemblies. The daughter card assemblies include line card assemblies and switch card assemblies. In such communication systems, high-speed differential electrical connectors mounted to the backplane mate with electrical connectors of the daughter card assemblies to transmit data signals through the communication system. In a conventional backplane communication system, the backplane is a large circuit board having conductive traces that interconnect the differential connectors of the backplane. The backplane and other components of the system are typically held by a chassis or cabinet.

More recently, the conventional backplane communication systems have been replaced by cable backplane systems. In a cable backplane system, cable connectors are mechanically mounted to a circuit board or a similar structure, such as sheet metal. Instead of traces, the cable connectors are communicatively coupled to one another through cables. The cable connectors may operate in a similar manner as the electrical connectors of the conventional system. By using cables, cable backplane systems avoid the use of traces through the backplane circuit board and, in some cases, may avoid using the large backplane circuit board altogether.

Both the conventional backplane systems and cable backplane systems have certain challenges. For example, both conventional and cable backplane systems have several components, such as line card assemblies, switch card assemblies, cooling fans, power supplies, etc., that must be held at designated positions within the system. Due to the large number of components along the backplane, access to certain parts of the chassis is limited. This problem can be worse for cable backplane systems in which the cables that interconnect the electrical connectors are typically located on one side of the backplane. The number of cables can be large and require a large amount of space to route them. Consequently, it can be challenging to install components when areas of the backplane are covered or blocked by other components of the system. For example, it can be difficult to mount components to the backplane using fasteners, such as screws.

Accordingly, a need remains for a mechanism of suitably mounting components to a support wall, such as a backplane in a backplane communication system.

BRIEF DESCRIPTION

In an embodiment, a mounting assembly for a backplane communication system is provided. The mounting assembly includes a retention collet that has a collet base and a coupling arm that extends from the collet base. The collet base includes a passage therethrough. The collet base is configured to be mounted to a backplane such that the passage extends through the backplane and the coupling arm extends from the collet base away from the backplane. The mounting assembly also includes a spacer member having a member cavity that receives the coupling arm when the spacer member is mounted to the backplane. The coupling arm is held in a locked position when engaged by a guide pin that has been inserted through the passage of the collet base and into the member cavity. The retention collet and the spacer member are interlocked when the coupling arm is in the locked position.

The coupling arm may have an inner surface and an outer surface that face in generally opposite directions. The inner surface may be configured to extend along and directly engage the guide pin when the coupling arm is in the locked position. The outer surface may be configured to directly engage an interior surface of the spacer member that defines the member cavity.

Optionally, the coupling arm may be deflected in a first lateral direction by the interior surface as the spacer member is mounted to the backplane and, subsequently, pressed in a different second lateral direction as the guide pin is inserted into the member cavity. The coupling arm and the interior surface may be shaped relative to each other such that the spacer member is forced toward the backplane as the coupling arm is pressed into the interior surface by the guide pin. For example, a portion of the interior surface may at least partially face in a loading direction that is the same loading direction in which the guide pin is loaded, and a portion of the coupling arm may face in an opposite direction. The loading direction may be generally transverse to the first and second lateral directions.

In another embodiment, a backplane communication system is provided that includes a backplane having a mounting hole and a mating window that extend through the backplane. The backplane communication system also includes a retention collet having a collet base and a coupling arm that extends from the collet base. The collet base is secured to the backplane such that the coupling arm is proximate to the mounting hole and extends away from the backplane. The backplane communication system also includes a connector assembly configured to be mounted to the backplane. The connector assembly includes an electrical connector that is configured to be positioned proximate to the mating window of the backplane and a spacer member coupled to the electrical connector. The spacer member has a member cavity that receives the coupling arm of the retention collet when the connector assembly is mounted to the backplane. The coupling arm is held in a locked position when engaged by a guide pin that has been inserted through the mounting hole and into the member cavity. The retention collet and the spacer member are interlocked when the coupling arm is in the locked position.

DETAILED DESCRIPTION

Embodiments set forth herein include mounting assemblies and communication systems and connector assemblies that include the same. The mounting assemblies may be configured to secure a component to a backplane or midplane. As used herein, the terms "backplane" and "midplane" may be used interchangeably and include walls constructed from circuit board material, such as FR-4, or walls constructed from other materials, such as sheet metal. For simplicity, the term backplane is used hereafter.

The components that are secured to the backplane by the mounting assemblies may be various parts or objects. Such components may include, for example, an electrical connector, connector assembly, brick assembly, tray, power supply, or the like. To secure a component to the backplane, multiple stages or operations may be performed. By way of one example, during a first stage, a connector assembly may be removably coupled to the backplane along a first side of the backplane through a mounting assembly. The mounting assembly may include one or more elements that are coupled to the backplane and one or more elements that are coupled to the connector assembly. During a second stage, the mounting assembly may be triggered or activated to more securely couple the connector assembly to the backplane. During a third stage, the connector assembly, which is now secured to the backplane, may engage a daughter card assembly during a mating operation. The mounting assembly may resist or withstand forces that are generated during the mating operation such that the connector assembly remains secured to the backplane while mating with the daughter card assembly.

In some embodiments, the daughter card assembly may have a guide pin that is inserted in a first direction through a mounting hole of the backplane to activate the mounting assembly. When activated, the mounting assembly may generate a force that forces or urges the connector assembly in a second direction that is opposite the first direction and toward the backplane. The mounting assembly may resist withdrawal (or demounting) of the connector assembly while the mounting assembly is activated by the guide pin.

Although the following is with specific reference to a cable backplane system, the various embodiments set forth herein may be implemented in other types of communication systems and devices. For example, the communication system may be a backplane system in which the backplane includes traces that interconnect electrical connectors mounted to the backplane. In other embodiments, the communication system may include optical connectors that are mounted to a support wall. Moreover, the mounting assemblies described herein may be used to mount other components that do not transmit data signals to a support wall of the communication system.

The communication systems and connector assemblies may be used in various applications. By way of example only, the communication systems may be used in telecom and computer applications, routers, servers, supercomputers, and uninterruptible power supply (UPS) systems. One or more of the electrical connectors described herein may be similar to electrical connectors of the STRADA Whisper or Z-PACK TinMan product lines developed by TE Connectivity. For example, one or more of the electrical connectors may be capable of transmitting data signals at high speeds, such as 10 gigabits per second (Gb/s), 20 Gb/s, 30 Gb/s, or more. In more particular embodiments, one or more of the electrical connectors may be capable of transmitting data signals at 40 Gb/s, 50 Gb/s, or more. In some embodiments, the electrical connectors may include high-density, two-dimensional arrays of signal contacts. A high-density array may have, for example, at least 12 signal contacts per 100 $mm^2$ along a mating face of the electrical connector. In more particular embodiments, the high-density array may have at least 20 signal contacts per 100 $mm^2$ along a mating face of the electrical connector.

Figure 1:
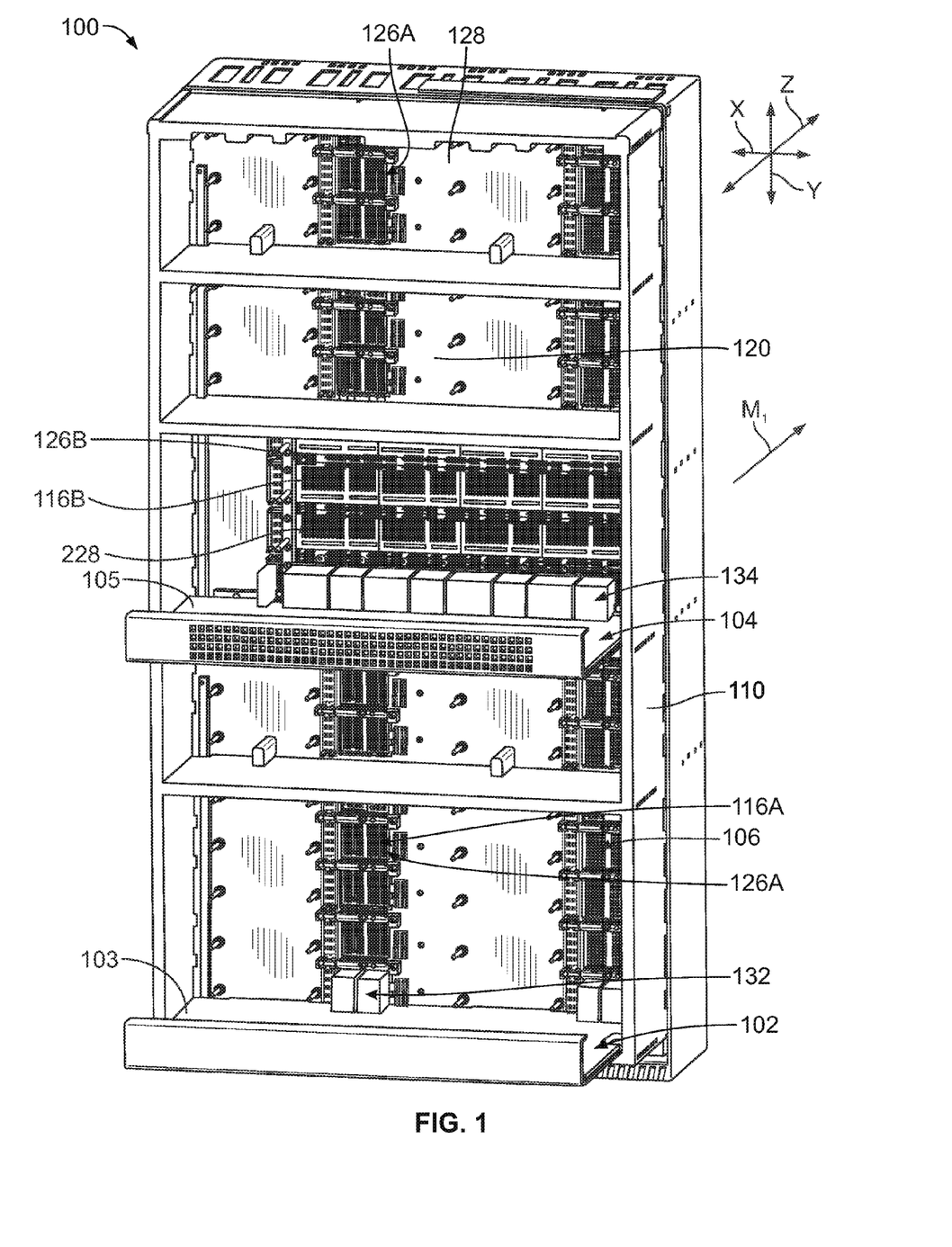
FIG. 1 is a front-perspective view of a cable backplane system formed in accordance with an embodiment.

FIG. 1 is a front perspective view of a cable backplane system 100 formed in accordance with an embodiment. The cable backplane system 100 may include a chassis 110, one or more backplanes 120 coupled to and supported by the chassis 110, and other electrical or communication components. For example, the components may include daughter card assemblies 102, 104 and cable connector assemblies 106 that interconnect the daughter card assemblies 102, 104. The backplane 120 may be a circuit board and may be manufactured from circuit board material known in the art, such as FR-4 material. In other embodiments, the backplane 120 may be formed from another suitable structure, such as sheet metal. Other components of the cable backplane system 100, which are not shown in FIG. 1, may include power supplies, fans, other connectors, guiderails, etc.

The daughter card assemblies 102, 104 are hereinafter referred to as a line card assembly 102 and a switch card assembly 104. The line card assembly 102 and the switch card assembly 104 include circuit boards (or daughter cards) 103, 105, respectively. The line card assembly 102 includes electrical connectors 132 positioned along a leading edge of the circuit board 103, and the switch card assembly 104 includes electrical connectors 134 positioned along a leading edge of the circuit board 105. In certain embodiments, the electrical connectors 132, 134 are high-speed differential connectors, such as STRADA Whisper or Z-PACK TinMan electrical connectors developed by TE Connectivity.

Only portions of the cable connector assemblies 106 are shown in FIG. 1. The cable connector assemblies 106 include cable connectors 116A and/or 116B that are mounted to the backplane 120. In the illustrated embodiment, the cable connectors 116A, 116B are interconnected to one another by cables (not shown) within the cable backplane system 100. The cable connector assemblies 106 eliminate interconnections via traces of a circuit board, such as the backplane 120. The cable connector assemblies 106 may have improved signal performance along the signal paths between various connectors of the cable backplane system 100 as compared to conventional backplanes. However, in alternative embodiments, the system 100 may be similar to conventional backplane communication systems that interconnect the electrical connectors through traces within the backplane.

The chassis 110 supports the various components of the cable backplane system 100. The chassis 110 may include one or more racks, one or more cabinets, or other suitable structures for holding the components of the cable backplane system 100. The chassis 110 may also include structures for guiding, supporting, and/or securing the line card assemblies 102 and the switch card assemblies 104 within the cable backplane system 100.

The cable backplane system 100 is oriented with respect to mutually perpendicular X-, Y-, and Z-axes. The backplane 120 is coupled to the chassis 110 and held in an upright position that extends along a lateral plane defined by the X- and Y-axes. The line card assemblies 102 and the switch card assemblies 104 are configured to be advanced toward the backplane 120 in a mating direction $M_1$ along the Z-axis. The backplane 120 may include a number of mating windows 126A, 126B that permit access through the backplane 120 so that the various connectors may be mated. For example, the cable connectors 116A, 116B may extend from a second side (not shown) of the backplane 120 and through the mating windows 126A, 126B, respectively, such that the cable connectors 116A, 116B are presented along a first or front side 128 of the backplane 120 for mating with the line card assemblies 102 and the switch card assemblies 104. At least some of the cable connectors may be coupled to one another in groups. For example, the electrical connectors 134 of the switch card assembly 104 are configured to mate with the cable connectors 116B of a connector assembly 228, which is hereinafter referred to as a brick assembly 228. The cable connectors 116A, 116B are not electrically connected to the backplane 120, as is typical of conventional backplanes, but rather the cable connectors 116A, 116B are interconnected by cables (not shown) extending between the cable connectors 116A, 116B.

Figure 2:
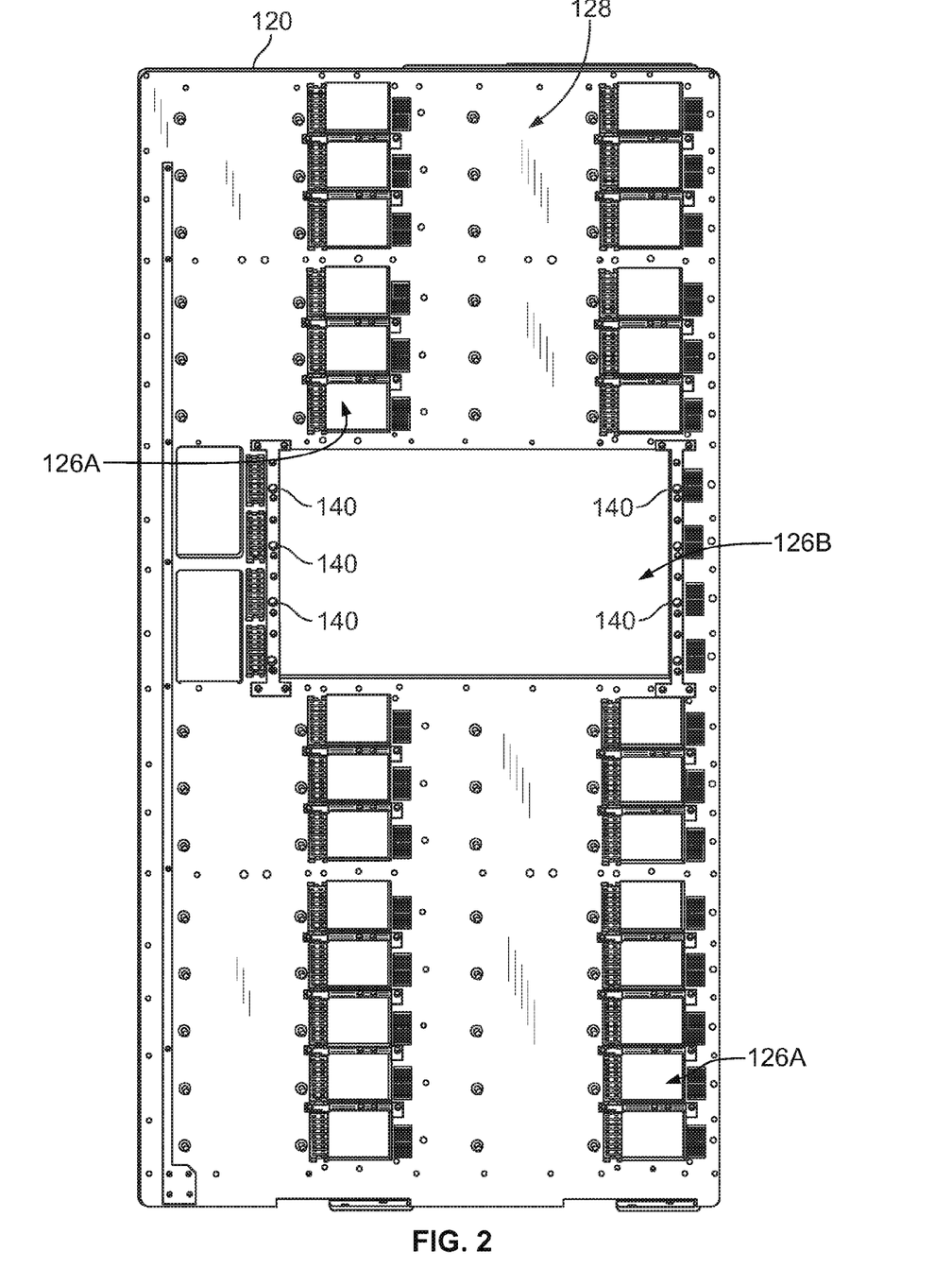
FIG. 2 is a plan view of a backplane that may be used with the cable backplane system of FIG. 1.

FIG. 2 illustrates the first side 128 of the backplane 120 in accordance with an embodiment. The backplane 120 includes the mating windows 126A, 126B that extend entirely through the backplane 120. The mating windows 126A are configured to receive the cable connectors 116A (FIG. 1). The mating windows 126B are configured to receive the brick assemblies 228 (FIG. 1), which each have a plurality of the cable connectors 116B. In the illustrated embodiment, the mating windows 126A are sized and shaped to receive single cable connectors 116A, and the mating windows 126B are sized and shaped to receive a plurality of the cable connectors 116B.

A plurality of retention collets 140 may be located along an edge of the mating window 126B. Similar to the retention collet 302 described below with respect to FIG. 5, the retention collets 140 are configured to engage the brick assemblies 228 and facilitate mounting the brick assemblies 228 to the backplane 120. In the illustrated embodiment, the retention collets 140 are located adjacent to the mating windows 126B. In other embodiments, however, the retention collets 140 may be further spaced apart from the mating window 126B. Moreover, in alternative embodiments, the retention collets 140 may be used to secure other components to the backplane 120, such as individual cable connectors 116A, power supplies (not shown), cooling fans (not shown), etc.

Figure 3:
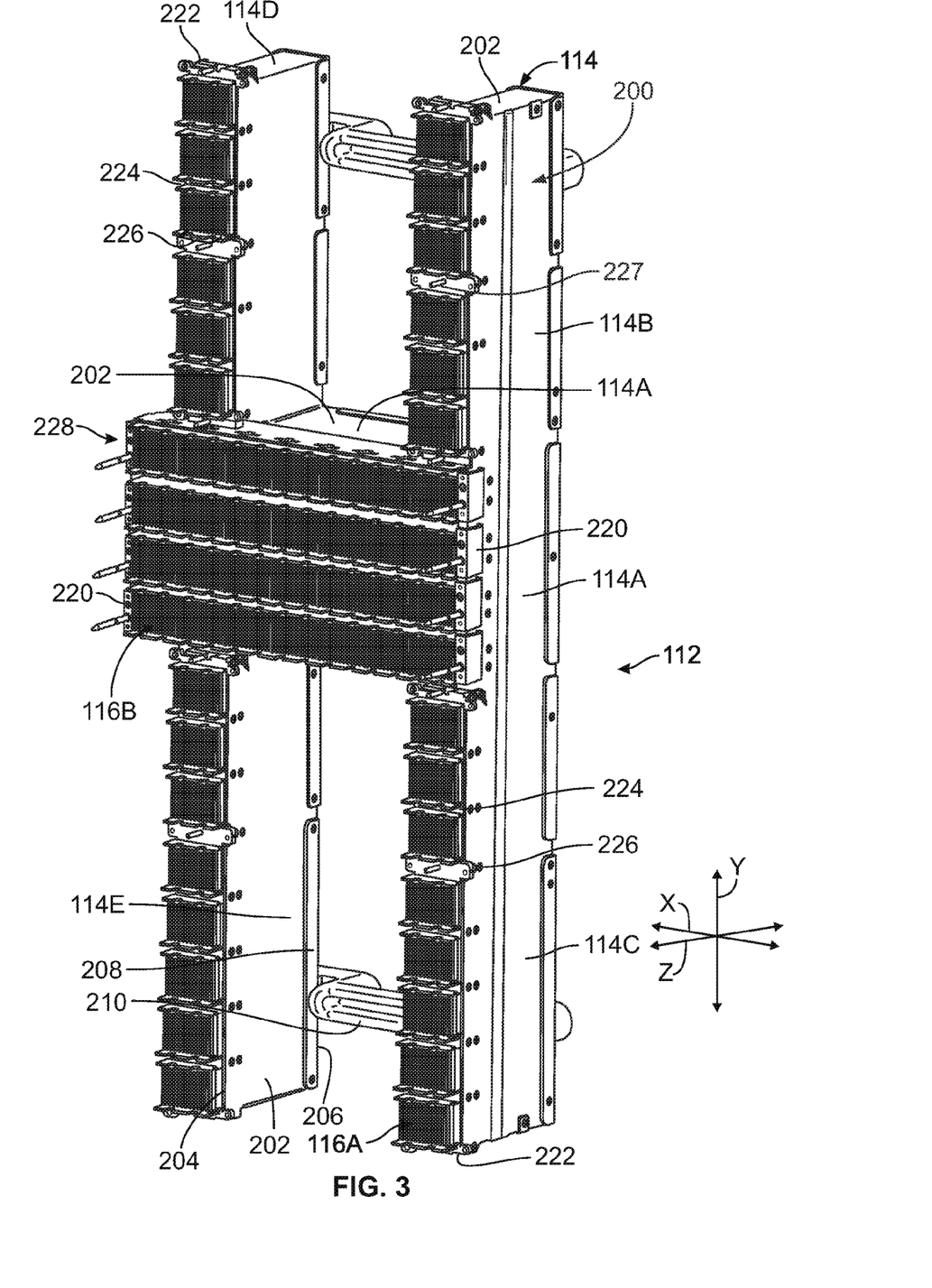
FIG. 3 illustrates a cable rack formed in accordance with an embodiment that may be used with the cable backplane system of FIG. 1.

FIG. 3 illustrates a cable rack 112 formed in accordance with an embodiment. The cable rack 112 includes a plurality of trays 114 and a plurality of the cable connectors 116A or 116B supported by the trays 114. The cable rack 112 is configured to be positioned along a second side (not shown) of the backplane 120 (FIG. 1) such that the cable connectors 116A, 116B extend through the mating windows 126A, 126B (FIG. 2), respectively. The trays 114 may be connected together to form the cable rack 112. In the illustrated embodiment, the cable rack 112 includes five trays 114a, 114b, 114c, 114d and 114e. However, the cable rack 112 may include any number of trays 114 in alternative embodiments. The trays 114a-114e are coupled together in an H-shaped configuration having the first tray 114a at a central location with the other trays 114b-114e extending outward from the first tray 114a as legs. The cable rack 112 may have other shapes in alternative embodiments.

In an exemplary embodiment, the first tray 114a holds the brick assemblies 228 having the cable connectors 116B. Each of the brick assemblies 228 includes a plurality of the cable connectors 116B. The cable connectors 116B of each brick assembly 228 are configured to be mated to the electrical connectors 134 (FIG. 1) of the switch card assembly 104 (FIG. 1). The other trays 114b-114e hold the cable connectors 116A that are mated with the electrical connectors 132 (FIG. 1) of the line card assemblies 102 (FIG. 1).

Each tray 114 includes a frame 200 that surrounds a pathway through which the cables (not shown) are routed. The pathways are open to one another to allow the cables to be routed from one tray 114 into another tray 114. The frame 200 includes sidewalls 202 extending between a front edge 204 and a rear 206 of the tray 114. A back wall 208 covers the pathway at the rear 206. The frame 200 is open at the front edge 204 between the sidewalls 202 to receive the corresponding cable connectors therein.

In the illustrated embodiment, the sidewalls 202 and back wall 208 are sheet metal pieces that are stamped, formed and coupled together, such as using fasteners or other connecting means. The sheet metal may be thin enough to allow the frame 200 to have some flexibility for moving, twisting or otherwise manipulating the trays 114 into position relative to the backplane 120 to position the cable connectors 116A with respect to the backplane 120. Optionally, the trays 114 may be connected to each other with some freedom of movement or float built in to the connection to allow the trays 114 to move relative to one another to properly align the cable connectors 116A, 116B with the mating windows 126A, 126B, respectively.

Optionally, the cable rack 112 includes handles 210 used to hold the trays 114 together. The handles 210 may be used to pick up the cable rack 112 and load the cable rack 112 onto the backplane 120 during assembly. Because of the size of the cable rack 112, the assembly and loading of the cable connectors 116A, 116B may be difficult. The handles 210 may enable easier loading of the cable rack 112. The handles 210 may be removed once the cable rack 112 is coupled to the backplane 120.

As shown, the cable rack 112 includes a plurality of spacer members 220, 222, 224, 226 that may be used to hold individual cable connectors 116A in designated positions, the brick assemblies 228 in designated positions, and/or the cable rack 112 in a designated position. The spacer members 220, 222, 224, 226 may be different types of spacer members and may have different sizes, shapes, and/or features. For example, the spacer members 220 are configured to engage the retention collets 140 (FIG. 2). In the illustrated embodiment, the spacer members 220 are provided along sides of corresponding brick assemblies 228 that are located in the tray 114a. Each of the brick assemblies 228 includes a group or array of cable connectors 116B that are held together in a stacked arrangement for mating with the electrical connectors 134 of the switch card assembly 104.

With respect to the other spacer members, the spacer members 222 are provided at ends of the trays 114b-114e, such as to support the end-most cable connectors 116A in such trays 114. The spacer members 224 are provided between adjacent cable connectors 116A. More specifically, the spacer members 224 may support two cable connectors 116A. The spacer members 226 are provided between adjacent cable connectors 116A, similar to the spacer members 224. However, the spacer members 226 may have guide pins 227 extending therefrom, which may be used for guiding the cable rack 112 into alignment and engagement with the backplane 120.

In an exemplary embodiment, the cable connectors are movable relative to the corresponding spacer members to allow the cable connectors to align with the corresponding mating windows. For example, the spacer members 222, 224, 226 may allow floating of the cable connectors 116B along the X-, Y-, or Z-axes. The spacer member 220 may also allow floating of the cable connectors 116A along the X-, Y-, or Z-axes. Once the cable connectors 116A, 116B are positioned in the mating windows 126A, 126B, respectively, the spacer members 222, 224, 226 may be fixed to the backplane 120 using, for example, fasteners to securely couple the cable rack 112 to the backplane 120. Corresponding spacer members 220 and retention collets 140 (FIG. 2) may form mounting assemblies, such as a mounting assembly 300 (shown in FIG. 5), that secure the brick assemblies 228 to the backplane 120. In an exemplary embodiment, the cable connectors 116A, 116B are configured to float within the mating windows 126A, 126B, respectively, to accommodate positional tolerances and facilitate alignment and mating with the corresponding electrical connectors 132, 134.

Figure 4:
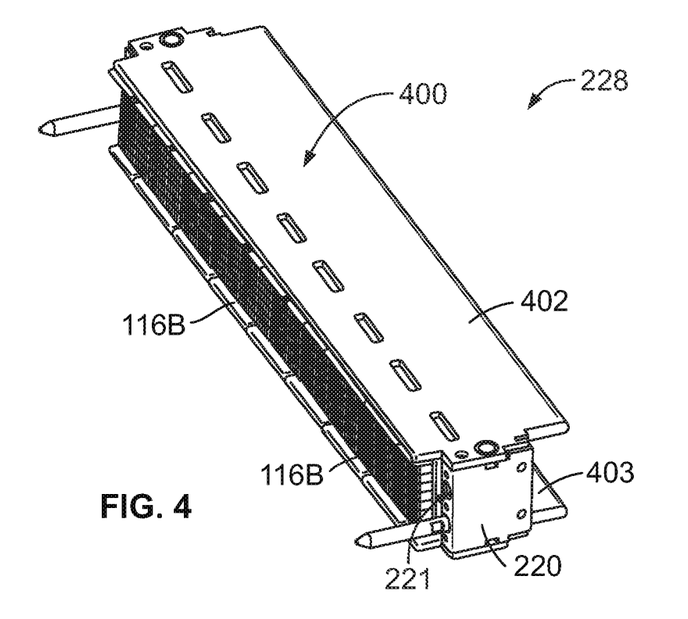
FIG. 4 is a perspective view of a connector assembly (or brick assembly) formed in accordance with an embodiment that may be used with the cable backplane system of FIG. 1.

FIG. 4 illustrates one of the brick assemblies 228, which may form part of the first tray 114a (FIG. 3). The brick assembly 228 has an assembly housing 400 that includes sidewalls 402, 403. In the illustrated embodiment, the sidewalls 402, 403 are top and bottom plates that oppose each other with the cable connectors 116B therebetween. The sidewalls 402, 403 hold the cable connectors 116B of the brick assembly 228. The cable connectors 116B may be permitted to float relative to the sidewalls 402, 403 and/or relative to the spacer members 220. As shown, the spacer members 220 may also be positioned between the sidewalls 402, 403 on opposite ends of the brick assembly 228. The spacer members 220 include member cavities 221. The member cavity 221 may be similar to the member cavity 352 (shown in FIG. 7) described below.

Figure 5:
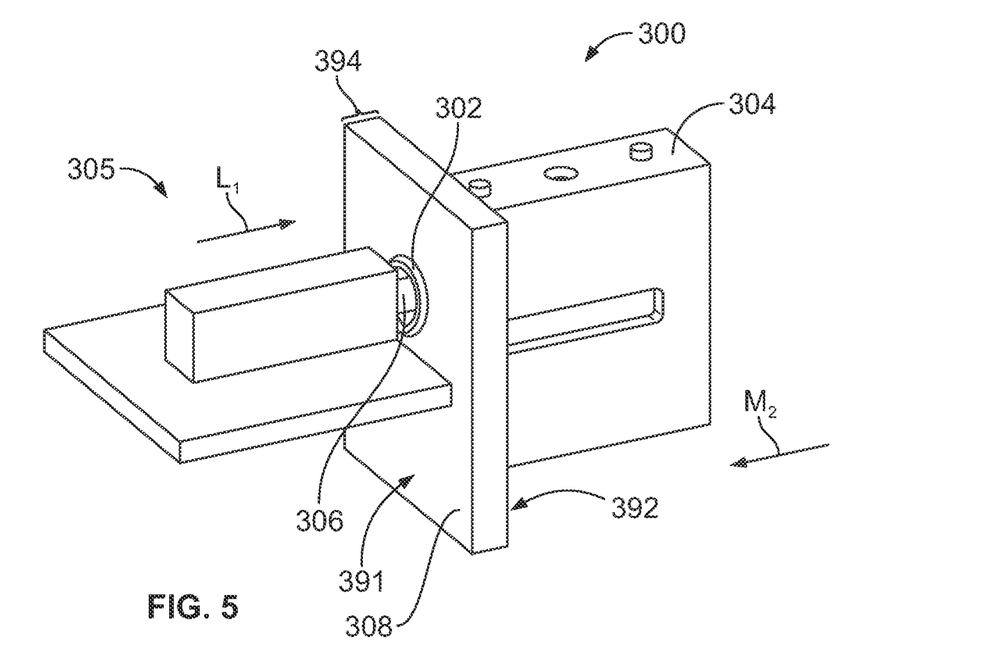
FIG. 5 is a perspective view of a mounting assembly formed in accordance with an embodiment that may be used with the cable backplane system of FIG. 1.

FIG. 5 is a perspective view of a mounting assembly 300 formed in accordance with an embodiment. The mounting assembly 300 may be used in a cable backplane system, such as the cable backplane system 100 (FIG. 1). The mounting assembly 300 includes a retention collet 302 and a spacer member 304, which may be similar to the retention collets 140 (FIG. 2) and the spacer members 220 (FIG. 3), respectively. The spacer members 222, 224, 226 (all shown in FIG. 3) may also be similar to the spacer member 304. The retention collet 302 may be manufactured from one or more materials. For example, the retention collet 302 may be metal, plastic, plastic that includes metal fibers, and the like. Likewise, the spacer member 304 may be manufactured from one or more materials, including metal, plastic, plastic with metal fibers, and the like. The spacer member 304 may be coupled to or part of a larger assembly, such as the connector or brick assembly 228 (FIG. 1). The retention collet 302 is secured within a mounting hole 309 (shown in FIG. 7) of a backplane 308. The mounting hole 309 extends entirely through a thickness 394 of the backplane 308. The retention collet 302 and the spacer member 304 are configured to engage each other such that the spacer member 304 (and other components attached to the spacer member 304) are secured to the backplane 308 and held in a substantially fixed position with respect to the backplane 308. In the illustrated embodiment, the backplane 308 is a circuit board that may or may not include traces (not shown) for interconnecting electrical connectors. In alternative embodiments, however, the backplane 308 may be a planar wall that is constructed from other materials, such as sheet metal.

The mounting assembly 300 is configured to engage a guide pin 306 from an electrical component, such as a daughter card assembly 305. The guide pin 306 may be manufactured from one or more materials, including metal, plastic, or plastic with metal fibers. Only a portion of the daughter card assembly 305 is shown in FIG. 5. The daughter card assembly 305 may be similar or identical to the line card assemblies 102 (FIG. 1) and the switch card assemblies 104 (FIG. 1) and include electrical connectors (not shown). When the guide pin 306 engages the retention collet 302 as shown in FIG. 5, the guide pin 306 may trigger or activate the mounting assembly 300 such that the retention collet 302 and the spacer member 304 are interlocked. The guide pin 306 may be inserted through the retention collet 302 in a loading direction $L_1$ (or mating direction) from a first side 391 of the backplane 308 and into the spacer member 304 on an opposite second side 392 of the backplane 308. When the guide pin 306 activates the mounting assembly 300, the mounting assembly 300 may provide a force that urges or biases the spacer member 304 in a mounting direction $M_2$ toward the backplane 308. The mounting direction $M_2$ is opposite the loading direction $L_1$. When activated, the mounting assembly 300 may prevent withdrawal of the spacer member 304 in the loading direction $L_1$.

In an exemplary embodiment, the mounting assembly 300 is used to hold a connector assembly (not shown) in a substantially fixed position relative to the backplane 308 so that electrical connectors (not shown) of the daughter card assembly 305 may engage electrical connectors (not shown) of the connector assembly. However, embodiments may be used in different applications in which it is desired to hold an electrical or optical connector alongside a wall of a communication system or device. More specifically, the mounting assemblies set forth herein may be used in applications that are not related to backplane communication systems.

Figure 6:
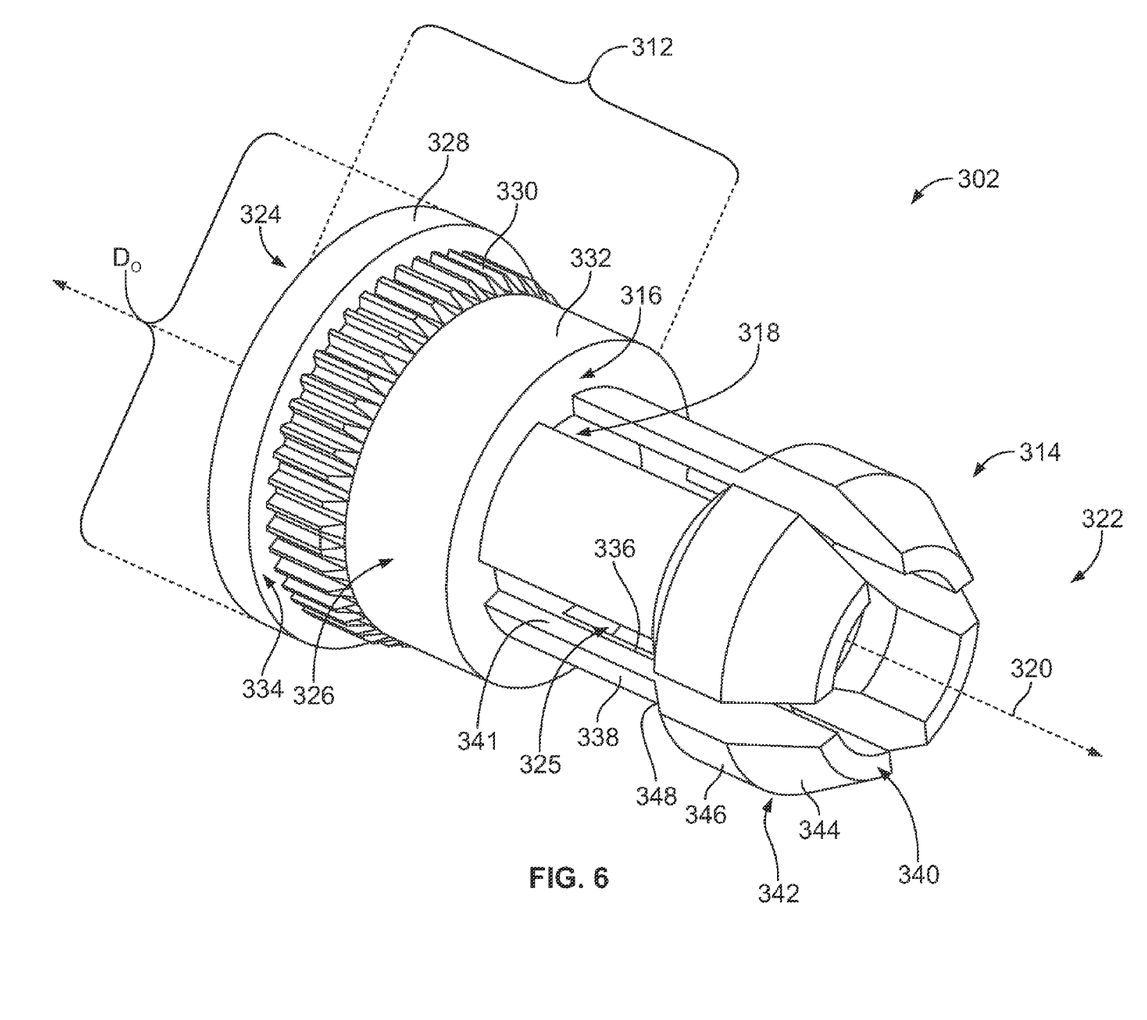
FIG. 6 is an isolated perspective view of a retention collet that may be used with the mounting assembly of FIG. 4.

FIG. 6 is an isolated perspective view of the retention collet 302. The retention collet 302 includes a collet base 312 and a plurality of coupling arms 314 that project from the collet base 312. As shown, the retention collet 302 has a generally elongated body that extends lengthwise along a collet axis 320 between a leading end 322 and a trailing end 324. The coupling arms 314 project from a member-facing surface or edge 316 of the collet base 312 to the leading end 322. The coupling arms 314 may include a bridge segment 341 that extends from the collet base 312 and a locking feature 342 that is connected to the collet base 312 through the bridge segment 341. The bridge segment 341 may be an elongated beam. The locking feature 342 is configured to grip the spacer member 304 (FIG. 5).

The coupling arms 314 are shown in relaxed or unengaged conditions and extend generally parallel to the collet axis 320. A total of four coupling arms 314 are shown in FIG. 6, but other embodiments may include more or fewer of the coupling arms 314. For instance, some embodiments may include only a single coupling arm 314. The coupling arms 314 are also shown as having identical shapes in FIG.

6 with different positions about the collet axis 320. In alternative embodiments, the shape or dimensions of the coupling arms 314 may be different.

The collet base 312 defines a passage 318 that is sized and shaped to permit the guide pin 306 (FIG. 5) to be inserted therethrough and into the spacer member 304 (FIG. 5). The collet axis 320 may extend through a center of the passage 318 and/or a geometric center of the collet base 312 when viewed along the collet axis 320. The coupling arms 314 are evenly distributed around the collet axis 320 and partially define an inner space 325. The inner space 325 represents a spatial volume that the coupling arms 314 may move into when, for example, the coupling arms 314 are deflected by the spacer member 304 as set forth below. In other embodiments, the coupling arms 314 may extend into the inner space 325 when in relaxed conditions. In such embodiments, the coupling arms 314 may be deflected radially away from the collet axis 320 when the guide pin 306 is inserted through the retention collet 302.

Figure 7:
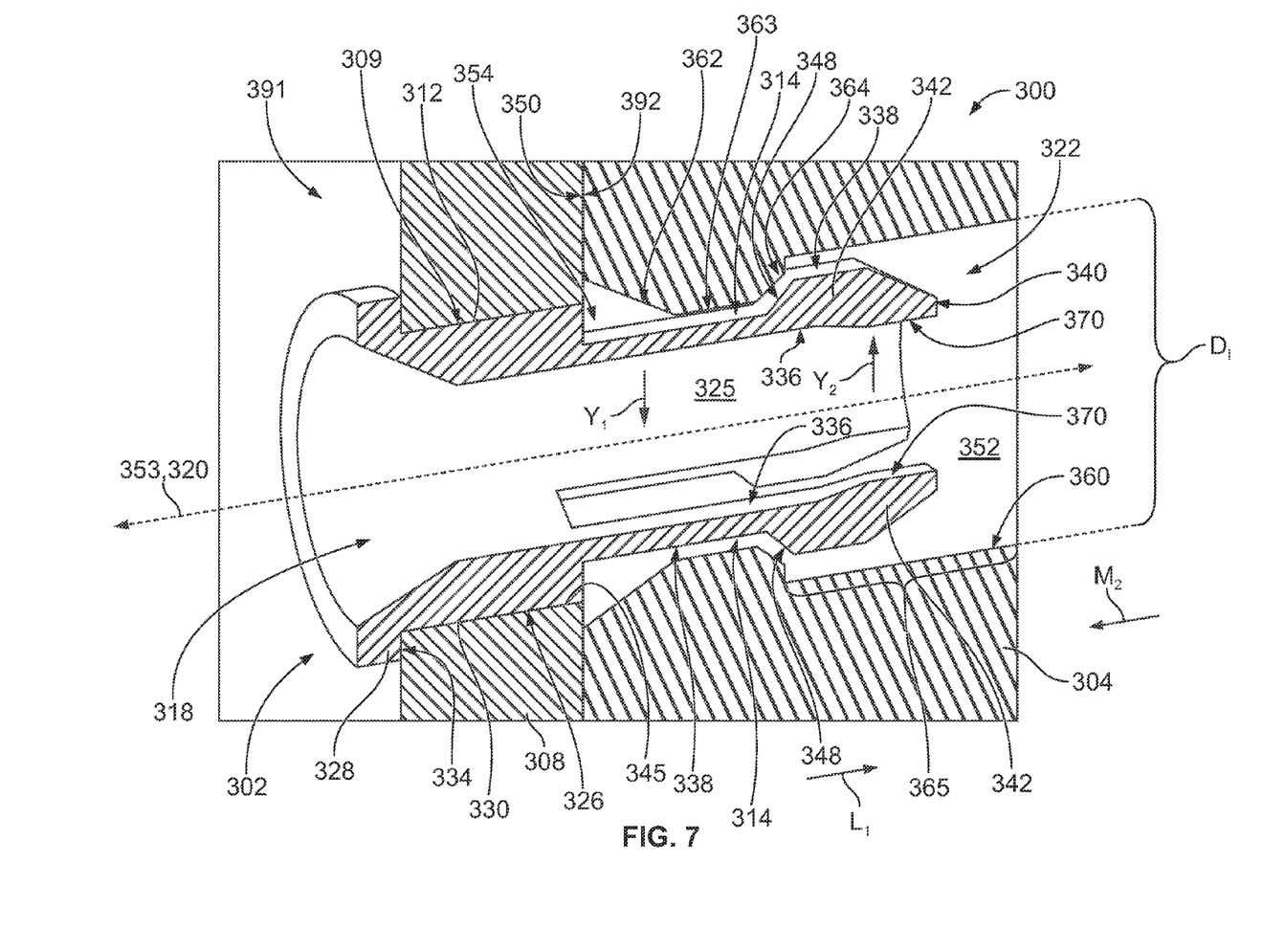
FIG. 7 is a cross-sectional view of the mounting assembly of FIG. 5 secured to a backplane.

The collet base 312 has an outer or exterior surface 326 that faces away from the collet axis 320. The collet base 312 has an outer diameter $D_O$ that is measured through the collet axis 320 and between opposite points of the exterior surface 326. The collet base 312 may be dimensioned to form an interference fit with the backplane 308 (FIG. 5) in the mounting hole 309 (FIG. 7).

In some embodiments, the outer diameter $D_O$ has different values at different portions of the collet base 312. For example, in the illustrated embodiment, the outer diameter $D_O$ incrementally reduces in size as the collet base 312 extends from the trailing end 324 to the leading end 322. The collet base 312 includes a flange portion 328, an interference portion 330, and a band portion 332. The flange portion 328 includes the trailing end 324 of the retention collet 302 and may have a largest value of the outer diameter $D_O$. The flange portion 328 includes a backplane-facing surface 334. The exterior surface 326 along the interference portion 330 may be adapted or patterned to enhance a frictional engagement with the backplane 308. For instance, the exterior surface 326 may have knurling, a corrugated surface, or a number of compressible projections. The band portion 332 may include the member-facing surface 316 and have the smallest value of the outer diameter $D_O$.

Each of the coupling arms 314 has an inner surface or side 336 and an outer surface or side 338 that face in generally opposite directions. The inner surface 336 is configured to extend along and directly engage the guide pin 306 (FIG. 5) when the coupling arm 314 is in a locked position. The outer surface 338 is configured to directly engage the spacer member 304 (FIG. 5). In the illustrated embodiment, the inner surface 336 and the outer surface 338 are curved and extend arcuately about the collet axis 320. The inner surface 336 faces the collet axis 320, and the outer surface 338 faces away from the collet axis 320. The inner surface 336 and the outer surface 338 extend from the collet base 312 to a distal end 340 of the coupling arm 314. The locking feature 342 is proximate to or includes the distal end 340. In alternative embodiments, the locking feature 342 may be located closer to the collet base 312.

The locking feature 342 is configured to engage an interior surface 360 (shown in FIG. 7) of the spacer member 304 (FIG. 5). The outer surface 338 along the locking feature 342 has a sloping or tapered area 344, a middle body area 346, and a driving area 348. The sloping area 344 of the locking feature 342 faces at least partially forward along the collet axis 320 and the driving area 348 faces at least partially rearward toward the collet base 312. When the retention collet 302 is mounted to the backplane 308, the sloping area 344 may face at least partially in the loading direction $L_1$ (FIG. 5), and the driving area 348 may face at least partially in the mounting direction $M_2$ (FIG. 5). The middle body area 346 faces radially away from the collet axis 320.

FIG. 7 is a cross-sectional view of the mounting assembly 300 coupled to the backplane 308. To couple the retention collet 302 to the backplane 308, the leading end 322 may be inserted through the mounting hole 309 in the loading direction $L_1$. As the interference portion 330 of the collet base 312 is inserted into the mounting hole 309, the exterior surface 326 may engage the interior surface 345 of the mounting hole 309 and form a frictional engagement with the backplane 308. The backplane-facing surface 334 of the flange portion 328 may engage the first side 391 of the backplane 308 thereby stopping movement of the retention collet 302 in the loading direction $L_1$. In the operative position shown in FIG. 7, the coupling arms 314 extend from the collet base 312 away from the second side 392 of the backplane 308.

The spacer member 304 includes a wall side or face 350 that is configured to interface with the second side 392. The spacer member 304 includes a member cavity 352 having an inlet 354 that opens to the wall side 350. The member cavity 352 is configured to receive the retention collet 302 during a mounting operation. The spacer member 304 may be manufactured using one or more methods. For example, the spacer member 304 may be molded or die-cast. As described herein, the spacer member 304 may be part of another component (not shown) and, as such, may be manufactured or formed along with other elements or features of the component. For example, the spacer member 304 may form part of a housing of an electrical connector or connector assembly.

The member cavity 352 is defined by the interior surface 360 and is configured to receive the retention collet 302. In the illustrated embodiment, the interior surface 360 is a single continuous or uninterrupted surface that defines the member cavity 352. In alternative embodiments, the interior surface 360 may include a number of discrete or separate surfaces. The member cavity 352 includes a plurality of cavity portions or areas 362-365 of the interior surface 360, which have different dimensions in the illustrated embodiment. In particular, the interior surface 360 includes a deflecting portion 362, a narrowed portion 363, a blocking portion 364, and a receiving portion 365. The deflecting portion 362 may include the inlet 354 in some embodiments.

The member cavity 352 has a member axis 353 that extends therethrough. In some embodiments, when the retention collet 302 is mounted to the backplane 308, the collet axis 320 may coincide with the member axis 353 as shown in FIG. 7. In the illustrated embodiment, the member cavity 352 has a circular cross-section taken transverse to the member axis 353 that varies as the member cavity 352 extends along the member axis 353. In alternative embodiments, the cross-section may have a different geometric shape, such as a square, pentagon, or other polygon.

The member cavity 352 is shaped relative to the coupling arms 314 so that the coupling arms 314 engage the interior surface 360 of the member cavity 352 to secure the spacer member 304 to the backplane 308. To this end, the member cavity 352 has an inner diameter $D_i$ that varies as the member cavity 352 extends from the inlet 354 in the mounting direction $L_1$. The inner diameter $D_i$ is measured through the member axis 353 between different opposing points of the interior surface 360.

The inner diameter $D_i$ along the cavity portions 362-365 has different values or dimensions. In the illustrated embodiment, the inner diameter $D_i$ along the deflecting portion 362 may decrease as the interior surface 360 extends from the inlet 354 toward the narrowed portion 363. The inner diameter $D_i$ along the narrowed portion 363 may have a substantially uniform value. As the blocking portion 364 extends from the narrowed portion 363 to the receiving portion 365, the inner diameter $D_i$ may increase in value. In the illustrated embodiment, the inner diameter $D_i$ along the receiving portion 365 has a substantially uniform value.

To mount the spacer member 304 to the backplane 308, the spacer member 304 may be aligned with the retention collet 302 such that the collet axis 320 and the member axis 353 approximately coincide. As the spacer member 304 is moved in the mounting direction $M_2$, the member cavity 352 may receive the coupling arms 314 through the inlet 354. If the retention collet 302 and the spacer member 304 are misaligned, one or more of the coupling arms 314 may engage the deflecting portion 362 thereby adjusting a position of the coupling arm(s) 314 and/or a position of the spacer member 304. The coupling arms 314 may be deflected toward the collet axis 320 (or the member axis 353) in a first lateral direction $Y_1$. As used herein, a "lateral direction" is a direction that extends generally parallel to a plane that coincides with the backplane 308. In some embodiments, a lateral direction may be radially toward the collet axis 320 or radially away from the collet axis 320.

When the coupling arms 314 are deflected, the coupling arms 314 may move into the inner space 325. The coupling arms 314 may be deflected such that the coupling arms 314 are capable of advancing into the member cavity 352 along the narrowed portion 363 of the interior surface 360. In the illustrated embodiment, as the locking features 342 clear the narrowed portion 363, the coupling arms 314 resiliently flex away from the collet axis 320 in a second lateral direction $Y_2$. The second lateral direction $Y_2$ is opposite the first lateral direction $Y_1$. When in the operative position as shown in FIG. 7, the blocking portion 364 of the interior surface 360 may directly oppose the driving areas 348 of the coupling arms 314.

In some cases, prior to the guide pin 306 (FIG. 5) being inserted through the passage 318, the spacer member 304 may be removably coupled to the backplane 308. More specifically, a weight of the spacer member 304 along the backplane 308 may be supported by the retention collet 302 such that a technician may release the spacer member 304 (or the component that includes the spacer member 304) without the spacer member 304 disengaging from the backplane 308. In some cases, a plurality of mounting assemblies 300 may be used so that the weight of the spacer members 304 and the component that includes the spacer members 304 may be distributed among the retention collets 302. For example, each of the brick assemblies 228 (FIG. 1) includes a plurality of the spacer members 220 (FIG. 3).

However, when the spacer member 304 is removably coupled to the backplane, the spacer member 304 may be withdrawn or demounted from the backplane 308 by moving the spacer member 304 in a direction that is opposite the mounting direction $M_2$ or, in the illustrated embodiment, by moving the spacer member 304 in the loading direction $L_1$. When the spacer member 304 is pulled away from the backplane 308, the coupling arms 314 are deflected radially inward by the blocking portion 364 of the interior surface 360, thereby permitting the spacer member 304 to be removed from the backplane 308.

As shown in FIG. 7, the coupling arms 314 may include respective gripping areas 370 along the inner surfaces 336. The gripping area 370 represents a portion of the coupling arm 314 along the inner surface 336 that is configured to directly engage the guide pin 306 (FIG. 5) when the guide pin 306 is inserted into the member cavity 352. The gripping area 370 may be a portion of the inner surface 336 that is closest to the member axis 353. In the illustrated embodiment, the gripping area 370 extends between the driving area 348 of the outer surface 338 and the distal end 340. More specifically, with respect to the collet axis 320, the gripping area 370 has an axial position that is further away from the backplane 308 than an axial position of the driving area 348.

In the illustrated embodiment, the retention collet 302 extends through the mounting hole 309 of the backplane 308. In alternative embodiments, the retention collet 302 may not extend through the backplane 308. For example, the retention collet 302 may have a collet base that is directly coupled to the second side 392 such that the coupling arm(s) 314 are located proximate to the mounting hole 309.

Figure 8:
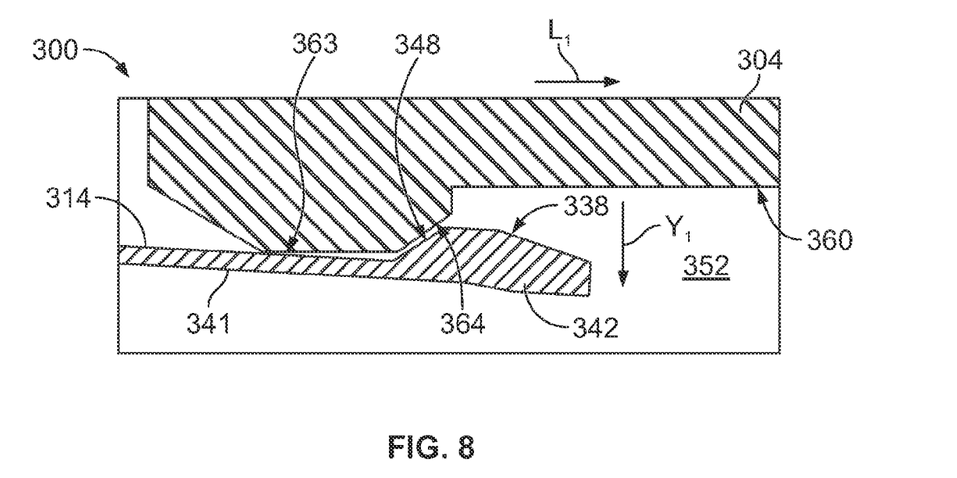
FIG. 8 is a cross-section of the mounting assembly of FIG. 5 showing a single coupling arm prior to being engaged by the guide pin.
Figure 9:
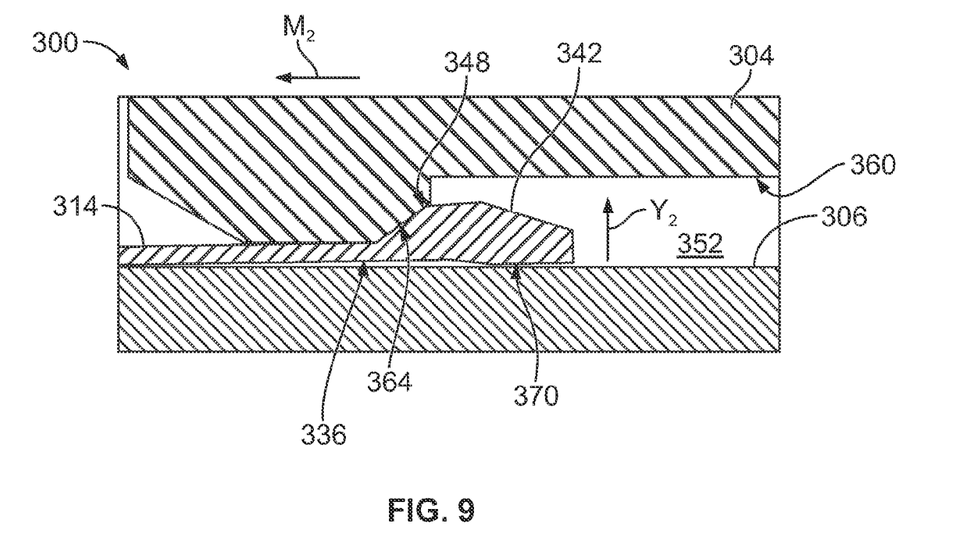
FIG. 9 is a cross-section of the mounting assembly of FIG. 5 showing the coupling arm after being engaged by the guide pin in a locked position.

FIGS. 8 and 9 show enlarged cross-sections of the mounting assembly 300 before and after, respectively, the guide pin 306 (FIG. 9) has been inserted into the member cavity 352. The following describes the mechanism by which the guide pin 306, a single coupling arm 314, and the interior surface 360 of the spacer member 304 cooperate to interlock the spacer member 304 and the backplane 308 (FIG. 5). The cross-sections in FIGS. 8 and 9 illustrate one particular interaction, but it is understood that other coupling arms 314 may be positioned differently and/or engage the interior surface 360 in a different manner when deflected by the guide pin 306. For example, in FIG. 8, the bridge segment 341 of the coupling arm 314 is engaged to the narrowed portion 363 of the interior surface 360. The bridge segment 341 supports a weight of the spacer member 304 before the guide pin 306 is inserted into the member cavity 352. At this time, the locking feature 342 is not directly engaged with the spacer member 304. However, also at this time, other coupling arms 314 may be spaced apart from the interior surface 360 or may engage the interior surface 360 at a different area.

FIG. 8 illustrates the spacer member 304 when the spacer member 304 is removably coupled to the backplane 308 (FIG. 5). The spacer member 304 may be loosely engaged to one or more of the coupling arms 314 when removably coupled to the backplane 308. For instance, when removably coupled, the spacer member 304 may be readily separated from the backplane 308 by pulling the spacer member 304 in the loading direction $L_1$ away from the backplane 308. In the illustrated embodiment, the spacer member 304 is removably coupled to the backplane 308 when the guide pin 306 is absent from the member cavity 352. At this time, at least a portion of the weight of the spacer member 304 may be supported by the retention collet 302 (FIG. 7). In some embodiments, when the spacer member 304 is removably coupled to the backplane 308, the driving area 348 along the outer surface 338 of the coupling arm 314 may impede or partially resist movement of the spacer member 304 in the loading direction $L_1$. Nonetheless, a suitable withdrawing force in the loading direction $L_1$ may overcome the resistance of the coupling arm 314. When pulled away from the backplane 308, the blocking portion 364 may engage the driving area 348 and deflect the coupling arm(s) 314 in the first lateral direction $Y_1$.

With respect to FIG. 9, as the guide pin 306 is inserted into the member cavity 352, the guide pin 306 may engage the inner surface 336 of the coupling arm 314. For example, the guide pin 306 may engage the gripping area 370 along the inner surface 336, thereby deflecting the coupling arm 314 in the second lateral direction $Y_2$. The coupling arm 314 may move radially outward away from the collet axis 320 (FIG. 7) or the member axis 353 (FIG. 7). The driving area 348 of the locking feature 342 may directly engage the blocking portion 364 of the interior surface 360. Because of the relative configurations of the interior surface 360 and the coupling arm 314, the coupling arm 314 may move the spacer member 304 in the lateral direction $Y_2$ and/or press against the interior surface 360 to force the spacer member 304 toward the backplane 308 in the mounting direction $M_2$. For example, the driving area 348 and the blocking portion 364 are angled relative to the collet axis 320 or the member axis 353 such that the coupling arm 314 is capable of driving the spacer member 304 in the mounting direction $M_2$. In some embodiments, the blocking portion 364 and the driving area 348 may slide along each other.

Figure 10:
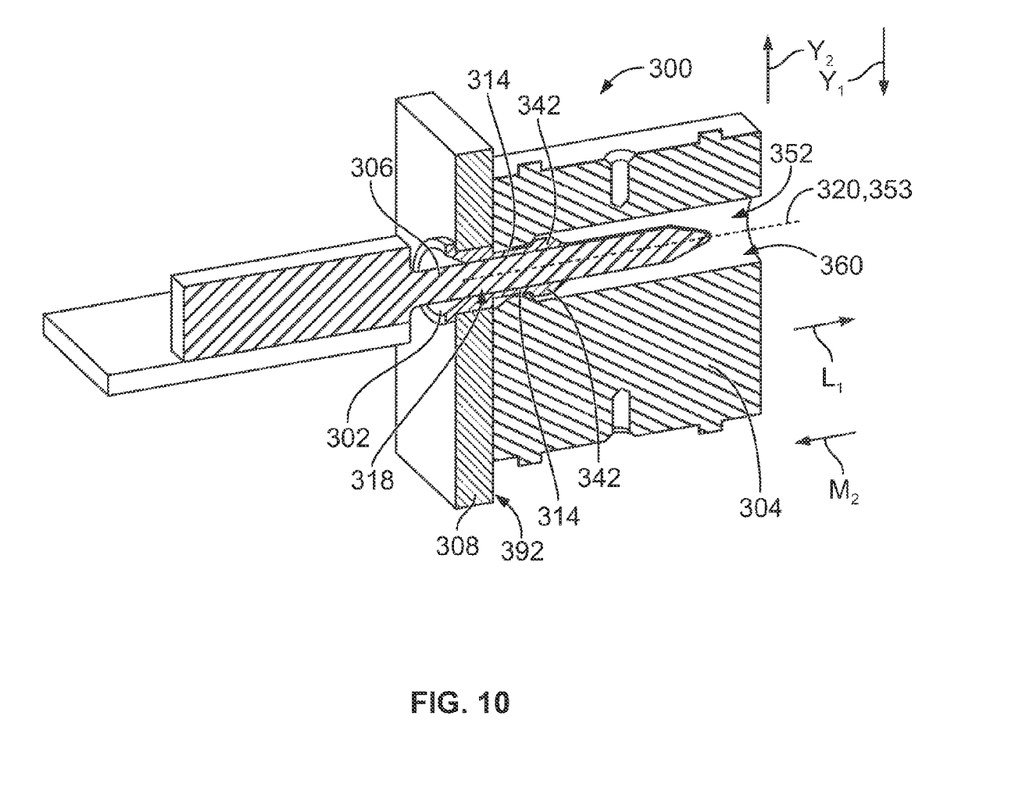
FIG. 10 is a cross-sectional view of the mounting assembly engaged with a guide pin of a daughter card assembly.

FIG. 10 is a cross-sectional view of the mounting assembly 300 after the guide pin 306 has been inserted into the member cavity 352. When the guide pin 306 is fully inserted into the member cavity 352 as shown in FIG. 10, the coupling arms 314 are in respective locked positions. In the locked positions, the guide pin 306 prevents deflection of the coupling arms 314 toward the collet axis 320 or the member axis 353. As such, the locking features 342 of the coupling arms 314, when held in the locked positions, collectively stop the spacer member 304 from moving in the loading direction $L_1$. Moreover, because the coupling arms 314 are positioned circumferentially about the member axis 353, the coupling arms 314 prevent movement of the spacer member 304 laterally along the second side 392 of the backplane 308. For example, when the coupling arms 314 are in the locked positions, the spacer member 304 may not be capable of inadvertently moving in the lateral direction $Y_1$ or lateral direction $Y_2$.

Accordingly, the mounting assembly 300 may secure a component that includes the spacer member 304 to the backplane 308. In some embodiments, with the retention collet 302 mounted to the backplane 308, multiple stages or operations may be performed to secure the component to the backplane 308. For example, during a first stage, the component may be positioned so that the retention collet 302 and the member cavity 352 are aligned. The component may than be advanced toward the backplane 308 in the mounting direction $M_2$. The coupling arms 314 may be received within the member cavity 352 and deflected radially inward toward the collet axis 320. For one or more of the coupling arms 314, this may be in the first lateral direction $Y_1$. In some embodiments, the coupling arms 314 may be biased to flex away from the collet axis 320 after the locking features 342 clear a portion of the interior surface 360. When the coupling arms 314 are fully inserted, the component may be removably coupled to the backplane 308 through the mounting assembly 300.

During a second stage, the mounting assembly 300 may be triggered or activated when the guide pin 306 is inserted through the passage 318 and into the member cavity 352 to engage the coupling arms 314. The coupling arms 314 may be pressed radially outward by the guide pin 306 away from the collet axis 320. In the illustrated embodiment, the coupling arms 314 engage the spacer member 304 and force the spacer member 304 toward the backplane 308 in the mounting direction $M_2$.

Optionally, during a third stage, the component, which is now secured to the backplane 308, may mate with another component. Returning to FIG. 1, the cable backplane system 100 may be used as an example. The component may be the brick assembly 228, which is configured to mate with the switch card assembly 104. As shown in FIG. 1, when secured to the backplane 120, the cable connectors 116B of the brick assembly 228 are located proximate to the mating window 126B. As the switch card assembly 104 and the brick assembly 228 engage each other, frictional forces may push the brick assembly 228 away from the backplane 120 in the mating direction $M_1$. However, because the mounting assembly (not shown) has been activated, the brick assembly 228 may remain in a substantially fixed position with respect to the backplane 120. More specifically, the mounting assembly may resist or withstand frictional forces that are generated during the mating operation such that the brick assembly 228 remains secured to the backplane 120 while mating with the switch card assembly 104. To demount the brick assembly 228, the switch card assembly 104 may be removed and, subsequently, the brick assembly 228 may be pulled away from the backplane 120.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A mounting assembly for a backplane communication system, the mounting assembly comprising:

a retention collet extending between a trailing end and a leading end, the retention collet including a collet base that has the trailing end and a coupling arm that extends from the collet base to the leading end, the collet base having a passage therethrough, wherein a collet axis extends through a center of the passage and wherein the collet base is configured to be mounted to a backplane such that the passage extends through the backplane and the coupling arm extends away from the backplane, the coupling arm extending generally parallel to the collet axis and having an inner surface that faces the collet axis and defines an inner space, the passage being a void that extends entirely through the collet base and is aligned with the inner space, the collet base defining an opening to the passage at the trailing end of the retention collet, the passage configured to permit a guide pin to be inserted through the opening at the trailing end and advance freely through the center of the passage and into the inner space, the inner surface shaped to slidably engage the guide pin as the guide pin advance through the inner space; and a spacer member having a member cavity that receives the coupling arm when the spacer member is mounted to the backplane, the coupling arm being held in a locked position when engaged by the guide pin that has been inserted through the passage of the collet base and into the member cavity, the retention collet and the spacer member being interlocked when the coupling arm is in the locked position.

2. The mounting assembly of claim 1, wherein the coupling arm has an outer surface, the inner and outer surfaces facing in generally opposite directions, the inner surface configured to extend along and directly engage the guide pin when the coupling arm is in the locked position, the outer surface configured to directly engage an interior surface of the spacer member that defines the member cavity.

3. The mounting assembly of claim 1, wherein the spacer member has an interior surface that defines the member cavity, the coupling arm capable of being deflected in a first lateral direction by the interior surface as the spacer member is mounted to the backplane and, subsequently, pressed in a different second lateral direction as the guide pin is inserted into the member cavity.

4. The mounting assembly of claim 1, wherein the spacer member includes an interior surface that defines the member cavity, the coupling arm and the interior surface being shaped relative to each other such that spacer member is forced toward the backplane as the coupling arm is pressed against the interior surface by the guide pin.

5. The mounting assembly of claim 1, wherein the spacer member has an interior surface that defines the member cavity and that includes a blocking portion, the guide pin advancing in a loading direction when the guide pin is inserted into the member cavity, the interior surface along the blocking portion at least partially facing in the loading direction.

6. The mounting assembly of claim 5, wherein the coupling arm has an outer surface including a driving area, the driving area being pressed against the blocking portion of the interior surface when the guide pin engages the coupling arm, wherein the driving area and the blocking portion are shaped relative to each other such that spacer member is forced toward the backplane as the driving area is pressed against the blocking portion.

7. The mounting assembly of claim 1, wherein the retention collet includes a plurality of the coupling arms, the coupling arms being positioned about the collet axis, each of the coupling arms extending generally parallel to the collet axis.

8. The mounting assembly of claim 7, wherein each of the coupling arms is configured to be deflected toward the collet axis by an interior surface of the spacer member that defines the member cavity as the spacer member is mounted to the backplane.

9. The mounting assembly of claim 1, wherein the collet base has an exterior surface that defines an outer diameter of the collet base, the outer diameter being greatest along a flange portion of the collet base that includes the trailing end.

10. A backplane communication system comprising:
a backplane having a mounting hole and a mating window extending through the backplane;
a retention collet including a collet base and a coupling arm that extends from the collet base, the collet base being secured to the backplane such that the coupling arm is proximate to the mounting hole and extends away from the backplane; and
a connector assembly configured to be mounted to the backplane, the connector assembly including an electrical connector that is configured to be positioned proximate to the mating window of the backplane and a spacer member coupled to the electrical connector, the spacer member having a member cavity that receives the coupling arm of the retention collet when the connector assembly is mounted to the backplane, the member cavity being defined by an interior surface of the spacer member, the coupling arm being held in a locked position when engaged by a guide pin that has been inserted through the mounting hole and into the member cavity, the coupling arm having an outer surface that engages the interior surface of the member cavity when in the locked position, the retention collet and the spacer member being interlocked when the coupling arm is in the locked position.

11. The mounting assembly of claim 1, wherein the member cavity and the coupling arm are designed relative to each other such that the coupling arm is capable of being deflected by the guide pin from an unengaged position to a locked position while the coupling arm is disposed within the member cavity, the coupling arm being held in the locked position when deflected by the guide pin that has been inserted through the passage of the collet base and into the member cavity.

12. The backplane communication system of claim 10, wherein the collet base includes a passage extending therethrough along a collet axis, the coupling arm extending generally parallel to the collet axis, the guide pin configured to be inserted through the passage.

13. The backplane communication system of claim 10, further comprising the guide pin and a daughter card assembly that includes the guide pin.

14. The backplane communication system of claim 13, wherein the coupling arm has an inner surface and an outer surface that face in generally opposite directions, the inner surface configured to extend along and directly engage the guide pin when the coupling arm is in the locked position, the outer surface configured to directly engage an interior surface of the spacer member that defines the member cavity.

15. The backplane communication system of claim 10, wherein the spacer member has an interior surface that defines the member cavity, the coupling arm capable of being deflected in a first lateral direction by the interior surface as the spacer member is mounted to the backplane and, subsequently, pressed in a different second lateral direction as the guide pin is inserted into the member cavity.

16. The backplane communication system of claim 10, wherein the spacer member includes an interior surface that defines the member cavity, the coupling arm and the interior surface being shaped relative to each other such that spacer member is forced toward the backplane as the coupling arm is pressed against the interior surface by the guide pin.

17. The backplane communication system of claim 10, wherein the retention collet includes a plurality of the coupling arms extending generally parallel to one another.

18. The backplane communication system of claim 10, wherein the collet base has an end of the retention collet and a passage therethrough, the passage extending through the backplane when the retention collet is secured to the backplane, the passage being a void that extends entirely through the collet base, the collet base defining an opening to the passage at the end of the retention collet, the passage configured to permit the guide pin to be inserted through the opening at the end and advance freely through a center of the passage.

19. The backplane communication system of claim 10, wherein the coupling arm has an outer surface that is configured to engage the spacer member and an inner surface that is configured to engage the guide pin, the outer surface including a driving area that at least partially faces toward the collet base when the coupling arm is in the locked position, the inner surface having a gripping area that is a portion of the inner surface that is closest to a center of the passage, the gripping area being further away from the collet base than the driving area.

20. A mounting assembly for a backplane communication system, the mounting assembly comprising:
   a retention collet extending between a trailing end and a leading end, the retention collet including a collet base that has the trailing end and a coupling arm that extends from the collet base to the leading end, the collet base having a passage therethrough extending along a collet axis, the coupling arm extending generally parallel to the collet axis, wherein the collet base is configured to be mounted to a backplane such that the passage extends through the backplane and the coupling arm extends away from the backplane, the passage being a void that extends entirely through the collet base, the collet base defining an opening to the passage at the trailing end of the retention collet, the passage configured to permit a guide pin to be inserted through the opening at the trailing end and advance freely through a center of the passage toward the leading end; and
   a spacer member having a member cavity that receives the coupling arm when the spacer member is mounted to the backplane, the coupling arm being held in a locked position when engaged by the guide pin that has been inserted through the passage of the collet base and into the member cavity, the retention collet and the spacer member being interlocked when the coupling arm is in the locked position;
   wherein the coupling arm has an outer surface that is configured to engage the spacer member and an inner surface that is configured to engage the guide pin, the outer surface including a driving area that at least partially faces toward the collet base when the coupling arm is in the locked position, the inner surface having a gripping area that is a portion of the inner surface that is closest to the collet axis and configured to engage the guide pin, the gripping area being further away from the collet base than the driving area.

* * * * *